(12) United States Patent
Nishijima et al.

(10) Patent No.: US 10,336,913 B2
(45) Date of Patent: Jul. 2, 2019

(54) CURABLE SILICONE COMPOSITION, CURED PRODUCT THEREOF, AND OPTICAL SEMICONDUCTOR DEVICE

(71) Applicant: Dow Corning Toray, Co., Ltd., Tokyo (JP)

(72) Inventors: Kazuhiro Nishijima, Ichihara (JP); Tomohiro Iimura, Ichihara (JP); Michitaka Suto, Ichihara (JP); Takashi Sagawa, Ichihara (JP); Haruhiko Furukawa, Ichihara (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 468 days.

(21) Appl. No.: 14/912,739

(22) PCT Filed: Aug. 27, 2014

(86) PCT No.: PCT/JP2014/073118
§ 371 (c)(1),
(2) Date: Feb. 18, 2016

(87) PCT Pub. No.: WO2015/030262
PCT Pub. Date: Mar. 5, 2015

(65) Prior Publication Data
US 2016/0208138 A1   Jul. 21, 2016

(30) Foreign Application Priority Data

Aug. 28, 2013 (JP) .................................. 2013-177365

(51) Int. Cl.
| | | |
|---|---|---|
| C09D 183/04 | (2006.01) | |
| H01L 33/56 | (2010.01) | |
| C08L 83/04 | (2006.01) | |
| C09D 5/22 | (2006.01) | |
| H01L 33/50 | (2010.01) | |
| C09D 7/61 | (2018.01) | |
| C08K 5/56 | (2006.01) | |
| C08L 83/00 | (2006.01) | |
| C08L 83/14 | (2006.01) | |
| C08G 77/12 | (2006.01) | |
| C08G 77/20 | (2006.01) | |
| C08K 5/54 | (2006.01) | |
| C08G 77/58 | (2006.01) | |

(52) U.S. Cl.
CPC ............. *C09D 183/04* (2013.01); *C08K 5/56* (2013.01); *C08L 83/00* (2013.01); *C08L 83/04* (2013.01); *C08L 83/14* (2013.01); *C09D 5/22* (2013.01); *C09D 7/61* (2018.01); *H01L 33/502* (2013.01); *H01L 33/56* (2013.01); *C08G 77/12* (2013.01); *C08G 77/58* (2013.01); *C08K 5/54* (2013.01); *C08K 2201/008* (2013.01); *C08L 2205/025* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC .......... C08G 77/80; C08G 77/20; C08G 77/12
See application file for complete search history.

(56) References Cited

U.S. PATENT DOCUMENTS

| | | |
|---|---|---|
| 3,267,036 A | 8/1966 | Baker |
| 6,124,407 A | 9/2000 | Lee et al. |
| 6,881,807 B2 | 4/2005 | Terada et al. |
| 8,044,153 B2 | 10/2011 | Yamamoto et al. |
| 8,278,408 B2 | 10/2012 | Goto et al. |
| 8,791,213 B2 | 7/2014 | Mizunashi et al. |
| 9,193,833 B2 | 11/2015 | Goto et al. |
| 2008/0015326 A1 | 1/2008 | Kodama et al. |
| 2009/0118441 A1 | 5/2009 | Yamamoto et al. |
| 2011/0077344 A1* | 3/2011 | Hasegawa ............... C08L 83/04 524/500 |

(Continued)

FOREIGN PATENT DOCUMENTS

| | | |
|---|---|---|
| AT | 498659 T | 3/2011 |
| CA | 1059306 A | 7/1979 |

(Continued)

OTHER PUBLICATIONS

International Search Report for Application No. PCT/JP2014/073118 dated Nov. 25, 2014, 3 pages.
English language abstract and original document not found for AT 498659; however, see English language equivalent U.S. Pat. No. 8,044,153.
English language abstract for CN 101300305 extracted from espacenet.com database on Feb. 24, 2016, 1 page.
English language abstract for CN 102105537 extracted from espacenet.com database on Feb. 29, 2016, 1 page.
English language abstract for CN 102414275 extracted from espacenet.com database on Feb. 29, 2016, 1 page.

(Continued)

Primary Examiner — Kuo Liang Peng
(74) Attorney, Agent, or Firm — Howard & Howard Attorneys PLLC (57) ABSTRACT

The present invention relates to a curable silicone composition comprising: (A) a diorganopolysiloxane having at least two alkenyl groups in a molecule, (B) at least two types of resinous organopolysiloxanes having different mass average molecular weights, (C) an organopolysiloxane having at least two silicon-bonded hydrogen atoms in a molecule, and (D) a hydrosilylation reaction catalyst. The curable silicone composition enables the production of an optical semiconductor device in which the marked viscosity elevation of the resulting composition can be inhibited, in which the fluidity and packing properties are outstanding and that has outstanding gas barrier properties when used as a sealant, and in which the device has outstanding initial optical output efficiency even when organopolysiloxane resin is blended in order to form cured product with moderate hardness and strength.

10 Claims, 1 Drawing Sheet

(56) References Cited

U.S. PATENT DOCUMENTS

| | | | |
|---|---|---|---|
| 2011/0172345 | A1 | 7/2011 | Goto et al. |
| 2012/0065343 | A1 | 3/2012 | Bahadur et al. |

FOREIGN PATENT DOCUMENTS

| | | | |
|---|---|---|---|
| CN | 101300305 A | | 11/2008 |
| CN | 102105537 A | | 6/2011 |
| CN | 102414275 A | | 4/2012 |
| CN | 103476896 A | | 12/2013 |
| EP | 0455384 A2 | | 11/1991 |
| EP | 0781812 A2 | | 7/1997 |
| EP | 1878768 A1 | | 1/2008 |
| EP | 1 945 716 B1 | | 2/2011 |
| EP | 2 305 755 A1 | | 4/2011 |
| JP | S51066344 A | | 6/1976 |
| JP | S51024377 B2 | | 7/1976 |
| JP | S60003040 B2 | | 1/1985 |
| JP | H 02-153969 A | | 6/1990 |
| JP | H0561308 B2 | | 9/1993 |
| JP | 2000-129132 A | | 5/2000 |
| JP | 2000-169714 A | | 6/2000 |
| JP | 2000-198930 A | | 7/2000 |
| JP | 2001-002922 A | | 1/2001 |
| JP | 2004331962 A | | 11/2004 |
| JP | 2006335857 A | | 12/2006 |
| JP | 2007063388 A | | 3/2007 |
| JP | 2007-131694 A | | 5/2007 |
| JP | 2008-101056 A | | 5/2008 |
| JP | 4965111 B2 | | 7/2012 |
| JP | 2012-207126 A | | 10/2012 |
| JP | 2012-528231 A | | 11/2012 |
| JP | 5085089 B2 | | 11/2012 |
| JP | 2012528231 A | | 11/2012 |
| JP | 2014019798 A | | 2/2014 |
| KR | 20040015156 A | | 2/2004 |
| KR | 2008-0070816 A | | 7/2008 |
| KR | 2011-0036936 A | | 4/2011 |
| KR | 2012-0023628 A | | 3/2012 |
| KR | 10-1333017 A | | 11/2013 |
| KR | 2014-0019368 A | | 2/2014 |
| MY | 142540 A | | 12/2010 |
| RU | 2011-139574 A | | 7/2013 |
| TW | 2010-09021 A | | 3/2010 |
| TW | 2012-49932 A | | 12/2012 |
| TW | I 402315 B | | 7/2013 |
| WO | WO 2007/055395 A1 | | 5/2007 |
| WO | WO 2010/010841 A1 | | 1/2010 |
| WO | WO 2010/138221 A1 | | 12/2010 |
| WO | WO 2012/132682 A1 | | 10/2012 |
| WO | 2011102272 A1 | | 6/2013 |

OTHER PUBLICATIONS

English language abstract and machine-assisted English translation for CN 103476896 extracted from espacenet.com database on Feb. 29, 2016, 28 pages.
English language abstract for JPH 02-153969 extracted from espacenet.com database on Feb. 24, 2016, 2 pages.
English language abstract for JP 2000-129132 extracted from espacenet.com database on Feb. 24, 2016, 1 page.
English language abstract and machine-assisted English translation for JP 2000-169714 extracted from espacenet.com database on Feb. 24, 2016, 10 pages.
English language abstract and machine-assisted English translation for JP 2000-198930 extracted from espacenet.com database on Feb. 24, 2016, 16 pages.
English language abstract and machine-assisted English translation for JP 2001-002922 extracted from espacenet.com database on Feb. 24, 2016, 6 pages.
English language abstract for JP 2007-131694 extracted from espacenet.com database on Feb. 24, 2016, 1 page.

English language abstract and machine-assisted English translation for JP 2008-101056 extracted from espacenet.com database on Feb. 24, 2016, 12 pages.
English language abstract and machine-assisted English translation for JP 2012-207126 extracted from espacenet.com database on Feb. 29, 2016, 29 pages.
English language abstract for JP 2012-528231 extracted from espacenet.com database on Feb. 24, 2016, 1 page.
English language abstract for KR 2008-0070816 extracted from espacenet.com database on Feb. 24, 2016, 1 page.
English language abstract not found for KR 2011-0036936; however, see English language equivalent U.S. Pat. No. 8,278,408. Original document extracted from espacenet.com database on Feb. 29, 2016, 16 pages.
English language abstract not found for KR 2012-0023628; however, see English language equivalent U.S. 2012/0065343. Original document extracted from espacenet.com database on Feb. 29, 2016, 17 pages.
English language abstract for KR 101333017 extracted from espacenet.com database on Feb. 24, 2016, 1 page.
English language abstract not found for KR 2014-0019368; however, see English language abstract of corresponding document WO 2012/132682. Original document extracted from espacenet.com database on Feb. 29, 2016, 14 pages.
English language abstract not found for RU 2011-139574; however, see English language equivalent U.S. 2012/0065343. Original document extracted from espacenet.com database on Feb. 29, 2016, 3 pages.
English language abstract for TW 2010-09021 extracted from espacenet.com database on Feb. 29, 2016, 1 page.
English language abstract for TW 2012-49932 extracted from espacenet.com database on Feb. 29, 2016, 1 page.
English language abstract for TWI 402315 extracted from espacenet.com database on Feb. 24, 2016, 1 page.
English language abstract for WO 2010/010841 extracted from espacenet.com database on Feb. 29, 2016, 2 pages.
English language abstract for WO 2012/132682 extracted from espacenet.com database on Feb. 24, 2016, 1 page.
English language abstract not found for JPS 51-066344; however, see English language equivalent CA 1 059 306. Original document extracted from espacenet.com on Oct. 11, 2018, 6 pages.
Machine-assisted English translation for JPS 51-024377 extracted from espacenet.com database on Oct. 11, 2018, 6 pages.
Machine-assisted English translation for JPS 60-003040 extracted from PAJ database on Oct. 11, 2018, 7 pages.
English language abstract and machine-assisted English translation for JPH 05-061308 extracted from espacenet.com database on Oct. 11, 2018, 9 pages.
English language abstract and machine-assisted English translation for JP 2004-331962 extracted from PAJ database on Oct. 11, 2018, 5 pages.
English language abstract and machine-assisted English translation for JP 2006-335857 extracted from PAJ database on Oct. 11, 2018, 8 pages.
English language abstract and machine-assisted English translation for JP 2007-063388 extracted from PAJ database on Oct. 11, 2018, 12 pages.
English language abstract for JP 4965111 extracted from espacenet.com database on Oct. 11, 2018, 2 pages; see also English language equivalent U.S. Pat. Appl. No. 8,044,153 previously cited in the IDS filed on May 19, 2016.
English language abstract for JP 2012-528231 extracted from espacenet.com database on Oct. 11, 2018, 1 page; see also English language equivalent U.S. 2012/0065343 previously cited in the IDS filed on May 19, 2016.
Machine-assisted English translation for JP 5085089 extracted from PAJ database on Oct. 11, 2018, 6 pages.
English language abstract for JP 2014-019798 extracted from espacenet.com database on Oct. 11, 2018, 1 page.
English language abstract for KR 2004-0015156 extracted from espacenet.com database on Oct. 11, 2018, 1 page.

(56) References Cited

OTHER PUBLICATIONS

English language abstract for WO 2011/102272 extracted from espacenet.com database on Oct. 11, 2018, 2 pages.

* cited by examiner

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Patent Application No. PCT/JP2014/073118, filed on Aug. 27, 2014, which claims priority to and all the advantages of Japanese Patent Application No. 2013-177365, filed on Aug. 28, 2013, the content of which is incorporated herein by reference.

TECHNICAL FIELD

The present invention relates to a curable silicone composition, a cured product thereof, and an optical semiconductor device produced using the composition.

Priority is claimed on Japanese Patent Application No. 2013-177365, filed on Aug. 28, 2013, the content of which is incorporated herein by reference.

BACKGROUND ART

Curable silicone compositions are used in the sealant, protective coating material, etc., of semiconductor elements in optical semiconductor devices such as light emitting diodes (LED). Examples of such curable silicone compositions include a curable silicone composition comprising: a diorganopolysiloxane having an average of two or more silicon-bonded alkenyl groups in a molecule; a resinous organopolysiloxane with a number average molecular weight of 2,000 to 5,000, having alkenyl groups, and comprising siloxane units represented by the formula: $SiO_{4/2}$ and siloxane units represented by the formula: $R_2R'SiO_{1/2}$ (in the formula, R represents a monovalent hydrocarbon group lacking aliphatic unsaturated bonds, and R' represents an alkenyl group); an organohydrogenpolysiloxane having an average of three or more silicon-bonded hydrogen atoms in a molecule; an adhesion promoter; and a hydrosilylation reaction catalyst (see Patent Document 1), and a curable silicone composition comprising: a diorganopolysiloxane having at least two silicon-bonded alkenyl groups in a molecule; a resinous organopolysiloxane comprising: siloxane units represented by the formula: $SiO_{4/2}$, siloxane units represented by the formula: $(CH_2{=}CH)R_2SiO_{1/2}$ (in the formula, R has the same significance as above), and siloxane units represented by the formula: $R_3SiO_{1/2}$ (in the formula, R has the same significance as above); an organohydrogenpolysiloxane having at least two silicon-bonded hydrogen atoms in a molecule; and a platinum metal catalyst (see Patent Documents 2 and 3).

While a cured product with little surface tack, moderate hardness and moderate strength can be derived by increasing the content of resinous organopolysiloxane in such a curable silicone composition, the resulting composition still suffers the defect of markedly high viscosity as well as low fluidity and packing properties.

In order to inhibit the viscosity rise and to enhance the fluidity and packing properties, Patent Document 4 proposes a curable silicone composition comprising: a diorganopolysiloxane having at least two alkenyl groups in a molecule; at least two types of resinous organopolysiloxanes having different mass average molecular weights and comprising: siloxane units represented by the formula: $SiO_{4/2}$, siloxane units represented by the formula: $R_2R'SiO_{1/2}$ (in the formula, R and R' have the same significance as above), and siloxane units represented by the formula: $R_3SiO_{1/2}$ (in the formula, R has the same significance as above); an organopolysiloxane having at least two silicon-bonded hydrogen atoms in a molecule; and a hydrosilylation reaction catalyst.

However, because of the high gas permeability of the cured product, these curable silicone compositions suffer sealant discoloration and a decline in luminance due to the corrosion of silver plated on the LED board brought about by corrosive gas when these curable silicone compositions are used as sealants of high brightness LED with great heat generation and great optical strength. An additional problem is the decline in the optical output efficiency when large quantities of fluorescents are blended in these curable silicone compositions for use as LED sealants.

PRIOR ART DOCUMENTS

Patent Documents

Patent Document 1: Japanese Unexamined Patent Application Publication No. 2000-129132
Patent Document 2: Japanese Unexamined Patent Application Publication No. 2000-198930
Patent Document 3: Japanese Unexamined Patent Application Publication No. 2001-002922
Patent Document 4: Japanese Unexamined Patent Application Publication No. 2007-131694

SUMMARY OF INVENTION

Technical Problem

An objective of the present invention is to provide a curable silicone composition that enables the production of an optical semiconductor device in which the marked viscosity elevation of the resulting composition can be inhibited, in which the fluidity and packing properties are outstanding and that has outstanding gas barrier properties when used as a sealant, and in which the device has outstanding optical output efficiency even when resinous organopolysiloxane is blended in order to form cured product with moderate hardness and strength.

Solution to Problem

The curable silicone composition of the present invention comprises:
(A) a diorganopolysiloxane having at least two alkenyl groups in a molecule and containing siloxane units represented by the formula: $R^1{}_2SiO_{2/2}$ (in the formula, $R^1$ represents an aryl group);
(B) at least two types of resinous organopolysiloxanes having different mass average molecular weights based on standard polystyrene conversion gel permeation chromatography and comprising: siloxane units represented by the formula: $SiO_{4/2}$, siloxane units represented by the formula: $R^2{}_2R^3SiO_{1/2}$ (in the formula, $R^2$ represents a monovalent hydrocarbon group lacking aliphatic unsaturated bonds, and $R^3$ represents an alkenyl group), and siloxane units represented by the formula: $R^2{}_3SiO_{1/2}$ (in the formula, $R^2$ has the same significance as above), in an amount of 10 to 100 parts by mass per 100 parts by mass of component (A);
(C) an organopolysiloxane having at least two silicon-bonded hydrogen atoms in a molecule, in an amount so that the amount of silicon-bonded hydrogen atoms in component (C) is from 0.1 to 10 mol per 1 mol of total alkenyl groups in components (A) and (B); and (D) a catalytic amount of hydrosilylation reaction catalyst.

Moreover, the cured product of the present invention is formed by curing the aforementioned curable silicone composition.

Furthermore, the optical semiconductor device of the present invention is characterized by the fact that the optical semiconductor element is sealed with a cured product of the aforementioned curable silicone composition.

Effects of Invention

The pronounced viscosity elevation of the resulting composition can be inhibited in the curable silicone composition of the present invention even if resinous organopolysiloxane is incorporated to form cured product with moderate hardness and strength. In addition, the fluidity and the packing properties are outstanding. The gas barrier properties are outstanding when this is used as a sealant, and an optical semiconductor device with outstanding initial optical output efficiency can be produced.

DETAILED DESCRIPTION OF THE INVENTION

First, the curable silicone composition of the present invention will be described in detail.

Component (A) is a main material of this composition, and is a diorganopolysiloxane having at least two alkenyl groups in a molecule and containing siloxane units represented by the formula: $R^1_2SiO_{2/2}$. The molecular structure of component (A) is essentially straight-chain, but part of the molecular chain may have some branching. Examples of the alkenyl group in component (A) include a vinyl group, an allyl group, an isopropenyl group, a butenyl group, a hexenyl group and a cyclohexenyl group, with a vinyl group being preferred. The bonding position of the alkenyl group is not restricted. The position may be, for example, the end of the molecular chain and/or the side-chain of the molecular chain. In addition, examples of groups that may be bound to silicon atoms other than the alkenyl groups in component (A) include alkyl groups such as methyl groups, ethyl groups, propyl groups; aryl groups such as phenyl groups, tolyl groups, xylyl groups; aralkyl groups such as benzyl groups or phenethyl groups; and halogenated alkyl groups such as 3-chloropropyl groups and 3,3,3-trifluoropropyl groups. Preferable examples include methyl groups and phenyl groups. In addition, component (A) contains siloxane units represented by the formula: $R^1_2SiO_{2/2}$. In the formula, $R^1$ represents an aryl group typified by phenyl groups, tolyl groups, xylyl groups, and naphthyl groups. Phenyl groups are preferable. Component (A) preferably would contain diphenyl siloxane units. In addition, there is no specific limitation on the viscosity of component (A). The viscosity at 25° C. preferably would be in the range of 100 to 1,000,000 mPa·s, or in a range of 100 to 100,000 mPa·s.

Examples of component (A) include copolymers of dimethylsiloxane and diphenylsiloxane capped at both molecular terminals with dimethylvinylsiloxy groups, copolymers of dimethylsiloxane and diphenylsiloxane capped at both molecular terminals with methylvinylphenylsiloxy groups, copolymers of dimethylsiloxane and dinaphthylsiloxane capped at both molecular terminals with dimethylvinylsiloxy groups, copolymers of dimethylsiloxane, methylvinylsiloxane, and diphenylsiloxane capped at both molecular terminals with dimethylvinylsiloxy groups, copolymers of dimethylsiloxane, methylphenylsiloxane, and diphenylsiloxane capped at both molecular terminals with dimethylvinylsiloxy groups, copolymers of methylvinylsiloxane and diphenylsiloxane capped at both molecular terminals with trimethylsiloxy groups, copolymers of dimethylsiloxane, methylvinylsiloxane, and diphenylsiloxane capped at both molecular terminals with trimethylsiloxy groups, and mixtures of two or more of these.

Diorganopolysiloxane represented by the following general formula is preferable as component (A).

[Formula 1]

In the formula, $R^1$ represents aryl groups that are the same as the aforementioned. In addition, $R^3$ in the formula, represents alkenyl groups typified by vinyl groups, allyl groups, isopropenyl groups, butenyl groups, hexenyl groups, and cyclohexenyl groups. Vinyl groups would be preferable. Furthermore, in the formula, $R^4$ represents a monovalent hydrocarbon group such as alkyl groups represented by methyl groups, ethyl groups, propyl groups; alkenyl groups represented by vinyl groups, allyl groups, isopropenyl groups, butenyl groups, hexenyl groups, cyclohexenyl groups; aryl groups represented by phenyl groups, tolyl groups, xylyl groups, naphthyl groups; aralkyl groups represented by benzyl groups and phenethyl groups; halogenated alkyl groups represented by 3-chloropropyl groups and 3,3,3-trifluoropropyl groups. Methyl groups and phenyl groups would be preferable. In addition, in the formula, $R^5$ represents a monovalent hydrocarbon group excluding aryl groups such as alkyl groups represented by methyl groups, ethyl groups, propyl groups; alkenyl groups represented by vinyl groups, allyl groups, isopropenyl groups, butenyl groups, hexenyl groups, cyclohexenyl groups; and halogenated alkyl groups represented by 3-chloropropyl groups and 3,3,3-trifluoropropyl groups. Methyl groups would be preferable.

Furthermore, in the formula, m represents an integer of 1 to 800, n represents an integer of 1 to 400, while m≥n and 5≤m+n≤1,000. Preferably, m represents an integer of 1 to 600, n represents an integer of 1 to 300, while m≥n and 5≤m+n≤750. Alternately, m represents an integer of 5 to 500, n represents an integer of 1 to 250, while m≥n and 5≤m+n≤500. The reason is that the refractive index of the resulting cured product rises when n is greater than or equal to the aforementioned minimum while the handling operational efficiency of the resulting composition is enhanced if n is less than or equal to the aforementioned maximum.

The following diorganopolysiloxanes are illustrative of component (A). In the formulas, Me, Vi, Ph, Naph, respectively, represent methyl groups, vinyl groups, phenyl groups and naphthyl groups, while m and n have the same significance as above.

ViMe$_2$SiO(Me$_2$SiO)$_m$ (Ph$_2$SiO)$_n$SiMe$_2$Vi
ViMe$_2$SiO(MePhSiO)$_m$ (Ph$_2$SiO)$_n$SiMe$_2$Vi
ViPhMeSiO(Me$_2$SiO)$_m$ (Ph$_2$SiO)$_n$SiPhMeVi
ViPhMeSiO(MePhSiO)$_m$ (Ph$_2$SiO)$_n$SiPhMeVi
ViPh$_2$SiO(Me$_2$SiO)$_m$ (Ph$_2$SiO)$_n$SiPh$_2$Vi
ViPh$_2$SiO(MePhSiO)$_m$ (Ph$_2$SiO)$_n$SiPh$_2$Vi
ViMe$_2$SiO(Me$_2$SiO)$_m$ (Naph$_2$SiO)$_n$SiMe$_2$Vi
ViMe$_2$SiO(MePhSiO)$_m$ (Naph$_2$SiO)$_n$SiMe$_2$Vi
ViPhMeSiO(Me$_2$SiO)$_m$ (Naph$_2$SiO)$_n$SiPhMeVi
ViPhMeSiO(MePhSiO)$_m$ (Naph$_2$SiO)$_n$SiPhMeVi
ViPh$_2$SiO(Me$_2$SiO)$_m$ (Naph$_2$SiO)$_n$SiPh$_2$Vi
ViPh$_2$SiO(MePhSiO)$_m$ (Naph$_2$SiO)$_n$SiPh$_2$Vi There is no limitation on the method of preparing such component (A). Examples include hydrolysis/condensation reactions in the presence of acid or alkali of silane compound (I-1) represented by the general formula:

$$R^4R^5SiX_2,$$

a silane compound (I-2) represented by the general formula:

$$R^1{}_2SiX_2,$$

a cyclic siloxane compound (II-1) represented by the general formula:

$$(R^4R^5SiO)_p,$$

and a cyclic siloxane compound (II-2) represented by the general formula:

$$(R^1{}_2SiO)_r,$$

or a straight-chain organosiloxane (III-1) represented by the general formula:

$$HO(R^4R^5SiO)_{m'}.H,$$

a straight-chain organosiloxane (III-2) represented by the general formula:

$$HO(R^1{}_2SiO)_{m'}.H,$$

a disiloxane (IV) represented by the general formula:

$$R^3R^4{}_2SiOSiR^4{}_2R^3,$$

and/or the silane compound (V) represented by the general formula:

$$R^3R^4{}_2SiX.$$

In the formula, $R^1$ represents an aryl group and has the same significance as above. In the formula, $R^3$ represents an alkenyl group and has the same significance as above. In the formula, $R^4$ represents a monovalent hydrocarbon group and has the same significance as above. In the formula, $R^5$ represents a monovalent hydrocarbon group excluding aryl groups and has the same significance as above. In the formula, m' and n' represent integers of 1 to 100. In the formula, p and r represent integers of 3 or more. In the formula, X represents an alkoxy group such as methoxy groups, ethoxy groups, propoxy groups; acyloxy groups such as acetoxy groups; halogen atoms such as chlorine atoms or bromine atoms; or hydroxyl groups.

Examples of the aforementioned silane compound (I-1) include dialkoxysilanes such as dimethyldimethoxysilane, diethyldimethoxysilane, dipropyldimethoxysilane, methylethyldimethoxysilane, phenylmethyldimethoxysilane, dimethyldiethoxysilane, diethyldiethoxysilane, dipropyldiethoxysilane, methylethyldiethoxysilane, phenylmethyldiethoxysilane; dihalosilanes such as dimethyldichlorosilane, diethyldichlorosilane, dipropyldichlorosilane, methylethyldichlorosilane, phenylmethyldichlorosilane; and dihydroxysilanes such as dimethyldihydroxysilane, diethyldihydroxysilane, dipropyldihydroxysilane, methylethyldihydroxysilane, phenylmethyldihydroxysilane.

Examples of the aforementioned silane compound (I-2) include dialkoxysilanes such as diphenyldimethoxysilane, dinaphthyldimethoxysilane, diphenyldiethoxysilane, dinaphthyldiethoxysilane; dihalosilanes such as diphenyldichlorosilane, dinaphthyldichlorosilane; dihydroxysilanes such as diphenyldihydroxysilane, dinaphthyldihydroxysilane.

Examples of the aforementioned cyclic siloxane compound (II-1) include cyclic diorganosiloxanes such as cyclic dimethylsiloxane, cyclic diethylsiloxane, cyclic methylphenylsiloxane, cyclic methylnaphthylsiloxane.

Examples of the aforementioned cyclic siloxane compound (II-2) include cyclic diorganosiloxanes such as cyclic diphenylsiloxane and cyclic dinaphthylsiloxane.

Examples of the aforementioned straight-chain organosiloxanes (III-1) include diorganosiloxanes capped at both molecular terminals with silanol groups, such as dimethylpolysiloxane capped at both molecular terminals with silanol groups, diethylpolysiloxane capped at both molecular terminals with silanol groups, dipropylpolysiloxane capped at both molecular terminals with silanol groups, and methylphenylpolysiloxane capped at both molecular terminals with silanol groups.

Examples of the aforementioned straight-chain organosiloxanes (III-2) include diorganosiloxanes capped at both molecular terminals with silanol groups, such as diphenylpolysiloxane capped at both molecular terminals with silanol groups, and dinaphthylpolysiloxane capped at both molecular terminals with silanol groups.

Examples of the aforementioned disiloxanes (IV) include 1,3-divinyl-1,1,3,3-tetramethyldisiloxane, 1,3-divinyl-1,1,3,3-tetraethyldisiloxane, 1,3-divinyl-1,3-dimethyl-1,3-diphenyldisiloxane, and 1,3-divinyl-1,1,3,3-tetraphenyldisiloxane.

Examples of the aforementioned silane compounds (V) include alkoxysilanes such as vinyldimethylmethoxysilane, vinyldiethylmethoxysilane, vinylmethylphenylmethoxysilane, vinylmethylnaphthylmethoxysilane, vinyldiphenylmethoxysilane, vinyldimethylethoxysilane, vinylmethylphenylethoxysilane, vinylmethylnaphthylethoxysilane, vinyldiphenylethoxysilane; acetoxysilanes such as vinyldimethylacetoxysilane, vinylmethylphenylacetoxysilane, vinylmethylnaphthylacetoxysilane, vinyldiphenylacetoxysilane; halosilanes such as vinyldimethylchlorosilane, vinylmethylphenylchlorosilane, vinylmethylnaphthylchlorosilane, vinyldiphenylchlorosilane; hydroxysilanes such as vinyldimethylhydroxysilane, vinylmethylphenylhydroxysilane, vinylmethylnaphthylhydroxysilane, vinyldiphenylhydroxysilane.

Examples of the aforementioned acids include hydrochloric acid, acetic acid, formic acid, nitric acid, oxalic acid, sulfuric acid, phosphoric acid, polyphosphoric acid, polybasic carboxylic acid, trifluoromethane sulfonic acid, and ion exchange resin.

Examples of the aforementioned alkali include hydroxides such as sodium hydroxide and potassium hydroxide; oxides such as magnesium oxide and calcium oxide.

Furthermore, an organic solvent may be used in the preparation method described above. Examples of organic solvents that can be used include aromatic or aliphatic hydrocarbons and mixtures of two or more types thereof. Examples of preferable organic solvents include toluene and xylene.

The volatile fractions such as unreacting cyclic siloxane compounds can be removed in the aforementioned preparation methods by extraction with large amounts of solvent or by removal at high temperatures under vacuum. The content of volatile fractions should be not greater than 10% by mass, and the content not greater than 5% by mass would be preferable.

Component (B) is a component that imparts moderate hardness and strength to the cured product of this composition, and is a resinous organopolysiloxane consisting of siloxane units represented by the formula: $SiO_{4/2}$, siloxane represented by the formula: $R^2{}_2R^3SiO_{1/2}$, and siloxane units represented by the formula: $R^2{}_3SiO_{1/2}$. In the formula, $R^2$ represents a monovalent hydrocarbon group lacking aliphatic unsaturated bonds, typified by alkyl groups such as methyl groups, ethyl groups, propyl groups; aryl groups such as phenyl groups, tolyl groups, xylyl groups, naphthyl groups; aralkyl groups such as benzyl group and phenethyl groups; and halogenated alkyl groups such as 3-chloropropyl groups, 3,3,3-trifluoropropyl groups. Desirable groups would be methyl groups and phenyl groups. In the formula, $R^3$ represents an alkenyl group, typified by vinyl groups, allyl groups, isopropenyl groups, butenyl groups, hexenyl groups and cyclohexenyl groups. A desirable group would be the vinyl group.

In addition, component (B) constitutes at least two types of resinous organopolysiloxanes having different mass average molecular weights based on standard polystyrene conversion gel permeation chromatography. Preferable examples would be two types of resinous organopolysiloxanes having a difference in mass average molecular weight of at least 1,000, two types of resinous organopolysiloxanes having a difference in mass average molecular weight of at least 1,500, or two types of resinous organopolysiloxanes having a difference in mass average molecular weight of at least 2,000. While there is no specific limitation on the proportions of the high-molecular weight constituent and the low-molecular weight constituent, the mass ratio (mass of high-molecular weight constituent: mass of low-molecular weight constituent) should be in the range of 50:50 to 5:95 when component (B) comprises two types of resinous organopolysiloxanes. There is no specific limitation on the mass average molecular weights of component (B) based on standard polystyrene conversion gel permeation chromatography, but a range of 100 to 10,000 would be preferable.

The content of component (B) would be in the range of 10 to 100 parts by mass per 100 parts by mass of component (A), preferably in the range of 20 to 100 parts by mass. That is because the hardness of the resulting cured product declines and surface tack develops if the content of component (B) is below the aforementioned minimum, while the viscosity of the resulting composition becomes extremely high if the aforementioned maximum is exceeded and the hardness of the resulting cured product becomes extremely high.

Component (C) is a crosslinking agent of the composition, and is an organopolysiloxane having at least two silicon-bonded hydrogen atoms in a molecule. The molecular structure of component (C) may be straight-chain, straight-chain with partial branching, branched-chain, circular or resinous. Straight-chain, straight-chain with partial branching, or resinous would be preferable. There is no specific limitation on the bonding site of silicon-bonded hydrogen atoms in component (C). For example, the end of the molecular chain and/or side chains of the molecular chain would be permissible. Examples of groups bound to silicon atoms other than hydrogen atoms in component (C) include alkyl groups such as methyl groups, ethyl groups, propyl groups; aryl groups such as phenyl groups, tolyl groups, xylyl groups, naphthyl groups; aralkyl groups such as benzyl groups and phenethyl groups; and halogenated alkyl groups such as 3-chloropropyl groups, 3,3,3-trifluoropropyl groups. Preferable examples would be methyl groups and phenyl groups. In addition, there is no specific limitation on the viscosity of component (C), and the viscosity at 25° C. preferably would be in the range of 1 to 10,000 mPa·s, preferably within the range of 1 to 1,000 mPa·s.

Examples of component (C) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-diglycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane capped at both molecular terminals with trimethylsiloxy groups, copolymer of dimethylsiloxane and methylhydrogensiloxane capped at both molecular terminals with trimethylsiloxy groups, dimethylpolysiloxane capped at both molecular terminals with dimethylhydrogensiloxy groups, copolymer of dimethylsiloxane and methylhydrogensiloxane capped at both molecular terminals with dimethylhydrogensiloxy groups, copolymer of methylhydrogensiloxane and diphenylsiloxane capped at both molecular terminals with trimethylsiloxy groups, copolymer of methylhydrogensiloxane, diphenylsiloxane, and dimethylsiloxane capped at both molecular terminals with trimethylsiloxy groups, hydrolysis condensates of trimethoxysilane, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units and $(C_6H_5)SiO_{3/2}$ units, and mixtures of two or more of these.

The content of component (C) should be in the range of 0.1 to 10 mol of silicon-bonded hydrogen atoms in this component per 1 mole of a total alkenyl groups in components (A) and (B). A range of 0.5 to 5 mol is preferable. That is because the resulting composition does not adequately cure if the content of component (C) falls below the minimum of the aforementioned range while the heat resistance of the resulting composition tends to decline if the aforementioned maximum is exceeded.

Component (D) is a hydrosilylation reaction catalyst for promoting curing of the composition. Examples include platinum-based catalysts, rhodium-based catalysts, and palladium-based catalysts. Platinum-based catalysts are preferable. Examples of platinum-based catalysts include platinum compounds such as platinum powder, platinum black, platinum-loaded fine silica powder, platinum-loaded activated carbon, chloroplatinic acid, alcohol solutions of chloroplatinic acid, olefin complexes of platinum, and alkenylsiloxane complexes of platinum.

The content of component (D) is a catalytic amount. Preferably, the content would be in the range of 0.01 to 1,000 ppm in terms of mass units of metal atoms in the catalyst relative to this composition. That is because there is a fear that curing of the resulting composition would not adequately proceed if the content of component (D) were to fall below the minimum in the aforementioned range while curing would not proceed markedly but there is a fear that problems with coloration of the cured product would arise if the content were to exceeded the maximum in the aforementioned range.

The composition comprises at least the aforementioned components (A) to (D), but (E) a cerium-containing organopolysiloxane as well is permissible as another arbitrary constituent in order to inhibit cracks in the resulting cured product due to thermal aging. Component (E) can be prepared by reacting cerium chloride or cerium salts of carboxylic acid with alkali metal salts of organopolysiloxane containing silanol group.

Example of the aforementioned cerium salts of carboxylic acid include cerium 2-ethylhexanoate, cerium naphthenate, cerium oleate, cerium laurate, and cerium stearate.

Examples of alkali metal salts of the aforementioned organopolysiloxane containing silanol group include potassium salts of diorganopolysiloxane capped at both molecular terminals with silanol groups, sodium salts of diorganopolysiloxane capped at both molecular terminals with silanol groups, potassium salts of diorganopolysiloxane capped at one molecular terminal with silanol group and capped at another molecular terminal with triorganosiloxy group, and sodium salts of diorganopolysiloxane capped at one molecular terminal with silanol group and capped at another molecular terminal with triorganosiloxy group. Examples of groups bonding with the silicon atoms in the organopolysiloxane include alkyl groups having from 1 to 12 carbons such as methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbons such as phenyl groups, tolyl groups, xylyl groups, and naphthyl groups; aralkyl groups having from 7 to 20 carbons such as benzyl groups, phenethyl groups, and phenyl propyl groups; and groups in which some or all of the hydrogen atoms of these groups are substituted with halogen atoms such as fluorine atoms, chlorine atoms, or bromine atoms.

The reaction described above is performed at room temperature or by heating in an alcohol such as methanol, ethanol, isopropanol, or butanol; an aromatic hydrocarbon such as toluene or xylene; an aliphatic hydrocarbon such as hexane or heptane; and an organic solvent such as mineral spirit, ligroin, or petroleum ether. It is preferable to distill off the organic solvent or low-boiling point components or to filter any sediment from the resulting reaction product as necessary. In order to accelerate this reaction, dialkylformamide, hexaalkylphosphamide, or the like may be added. The content of cerium atoms in the organopolysiloxane containing cerium prepared in this manner should be in the range of 1 to 5% by mass.

There is no specific limitation on the content of component (E), but it preferably would be in the range of 10 to 2,000 ppm in terms of mass units of cerium atoms to this composition, more preferably a range of 20 to 2,000 ppm, still more preferably a range of 20 to 1,000 ppm, and most preferably a range of 20 to 500 ppm. That is because the heat resistance of the resulting composition can be enhanced if the content of component (E) is greater than or equal to the minimum of the aforementioned range while the change in luminescent chromaticity can be reduced when it is used in optical semiconductor devices if the content is less than or equal to the maximum in the aforementioned range.

The present composition may also contain (F) a hydrosilylation reaction inhibitor as an optional component for extending the usable time at room temperature and improving the storage stability. Examples of such a component (F) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5, 7-tetravinylcyclotetrasiloxane and 1,3,5,7-tetramethyl-1,3,5,7-tetrahexenylcyclotetrasiloxane; alkynoxysilanes such as dimethyl bis-(3-methyl-1-butyn-3-oxy)silane and methylvinyl bis-(3-methyl-1-butyn-3-oxy)silane, and triallylisocyanurate compounds.

There is no specific limitation on the content of component (F). Preferably, it would be in the range of 0.01 to 3 parts by mass, more preferably 0.01 to 1 parts by mass per a total of 100 parts by mass of the aforementioned components (A) to (C). That is because the composition has a moderate usable duration if the content of component (F) is greater than or equal to the minimum of the aforementioned range while it has moderate operational efficiency if the content is less than or equal to the maximum in the aforementioned range.

In addition, the present composition may also contain (G) an adhesion promoter in order to further improve adhesion to the substrate with which the composition makes contact during curing. Such a component (G) is preferably an organosilicon compound having 1 or 2 or more silicon-bonded alkoxy groups in a molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organosilicon compound include substituted or unsubstituted monovalent hydrocarbon groups such as alkyl groups, alkenyl groups, aryl groups, aralkyl groups, and halogenated alkyl groups; glycidoxyalkyl groups such as 3-glycidoxypropyl groups and 4-glycidoxybutyl groups; epoxycyclohexylalkyl groups such as 2-(3,4-epoxycyclohexyl)ethyl groups and 3-(3,4-epoxycyclohexyl)propyl groups; oxiranylalkyl groups such as 4-oxiranylbutyl groups and 8-oxiranyloctyl groups; acrylic group-containing monovalent organic groups such as 3-methacryloxypropyl groups; isocyanate groups; isocyanurate groups; and hydrogen atoms.

The organosilicon compound preferably has a group that can react with the aliphatic unsaturated hydrocarbon groups or silicon-bonded hydrogen atoms in the present composition. Specifically, the organosilicon compound preferably has silicon-bonded aliphatic unsaturated hydrocarbon groups or silicon-bonded hydrogen atoms. The molecular structure of this organosilicon compound may be straight-chain, straight-chain with partial branching, branched-chain, circular or reticular. Straight-chain, branched-chain, and reticular are especially preferable. Examples of such organosilicon compounds include silane compounds such as 3-glycidoxypropyl trimethoxysilane, 2-(3,4-epoxycyclohexyl) ethyl trimethoxysilane, 3-methacryloxypropyl trimethoxysilane; siloxane compounds having at least one of silicon-bonded alkenyl groups or silicon-bonded hydrogen atoms, and at least one silicon-bonded alkoxy group in a molecule; mixtures of a silane compound or siloxane compound having at least one silicon-bonded alkoxy group, and a siloxane compound having at least one each of silicon-bonded hydroxy groups and silicon-bonded alkenyl groups in a molecule; and siloxane compounds represented by the average unit formula:

[Formula 2]

(in the formula, a, b, and c are positive numbers); and siloxane compounds represented by the average unit formula:

[Formula 3]

(in the formula, a, b, c, and d are positive numbers). The adhesion promoter preferably would be a low-viscosity liquid. While there is no specific limitation on the viscosity, it should be within the range of 1 to 500 mPa·s at 25° C.

There is no specific limitation on the content of component (G). Preferably it would be within the range of 0.01 to 10 parts by mass per a total of 100 parts by mass of components (A) to (C), preferably in the range of 0.1 to 3 parts by mass. This is because the adhesion is favorable when the content of component (G) is greater than or equal to the lower limit of the range described above, and the storage stability is favorable when the content is less than or equal to the upper limit of the range described above.

Furthermore, this composition may contain (H) a fluorescent substance, as another arbitrary constituent. Examples of such a component (H) include yellow, red, green, and blue light-emitting fluorescent substances consisting of oxide fluorescent substances, oxynitride fluorescent substances, nitride fluorescent substances, sulfide fluorescent substances, oxysulfide fluorescent substances, or the like, which are widely used in light-emitting diodes (LEDs), for example. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type CASN red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions. One type or a mixture of 2 or more types of these fluorescent materials may be used.

There is no specific limitation on the mean particle diameter of component (H). Preferably, it would be within the range of 1 to 50 μm, preferably 5 to 20 μm. That is because the viscosity elevation during mixing is inhibited if the mean particle diameter of component (H) is greater than or equal to the minimum of the aforementioned range, while the optical permeability is good if the diameter is less than or equal to the maximum of the aforementioned range.

There is no specific limitation on the content of component (H), but a range of 0.1 to 70% by mass of this composition is desirable. A level not greater than 70% by mass is preferable when considering the handling operational efficiency, and a level not less than 5% by mass is preferable when considering optical conversion to white light.

The composition has outstanding fluidity and packing properties. Depending on the application, there is no specific limitation on its viscosity, but a range of 100 to 500,000 mPa·s at 25° C. would be preferable, and a range of 100 to 100,000 mPa·s would be especially desirable.

The cured product of the present invention will now be described in detail.

Figure 2:
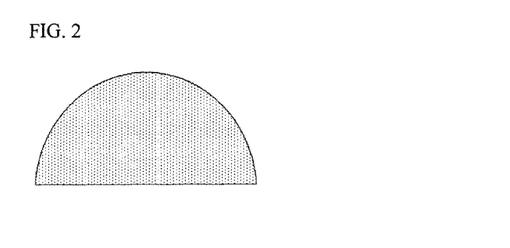
FIG. 2 is a cross-sectional view of a lens that is an example of a cured product of the present invention.

The cured product of the present invention is formed by curing the curable silicone composition described above. The shape of the cured product of the present invention is not particularly limited, and examples include a sheet-shape, a film-shape, a convex lens shape, a concave lens shape, a Fresnel lens shape, a truncated cone shape, and a square cone platform. The cured product of the present invention can be handled alone or in a state in which it covers, seals, or adheres an optical semiconductor element or the like. A cross-sectional drawing of a lens that is an example of a cured product of the present invention is illustrated in FIG. 2.

The optical semiconductor device of the present invention will now be explained in detail.

The optical semiconductor device of the present invention is produced by sealing an optical semiconductor element with a cured product of the curable silicone composition described above. Examples of such an optical semiconductor device of the present invention include a light emitting diode (LED), a photocoupler, and a CCD. Examples of light emitting diodes (LEDs) include SMD (surface Mount Device) type and COB (Chip on Board) type. Examples of SMD include top-view type and side-view type. Examples of optical semiconductor elements include light emitting diode (LED) chips and solid-state image sensing devices. Examples of light emitting diode chips include face-up type and flip-chip type. Furthermore, examples of light emitting diode chips include Ga—As containing infrared LED chip, Ga—Al—As containing red LED chip, Ga—As—P containing orange or yellow LED chip, nitrogen-doped Ga—As containing yellow LED chip, and gallium nitride compound-containing blue or bluish-violet LED chip.

Figure 1:
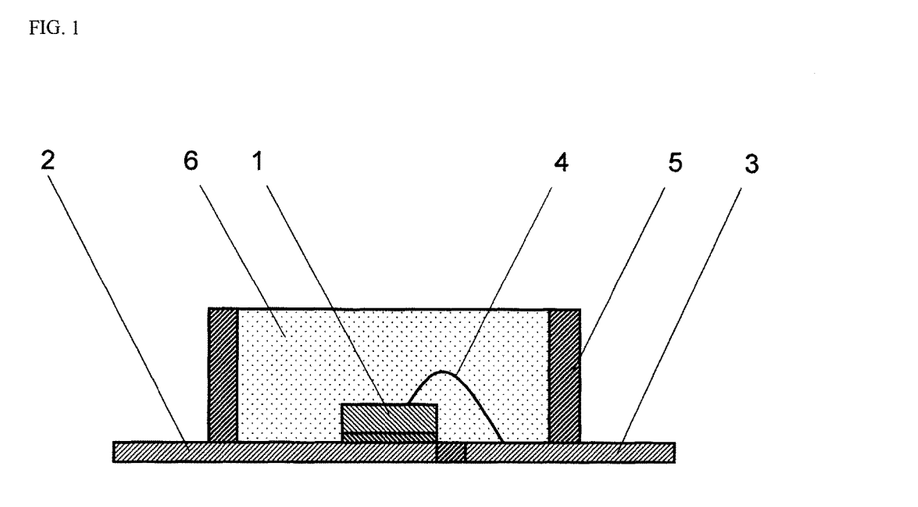
FIG. 1 is a cross-sectional view of an LED that is an example of an optical semiconductor device of the present invention.

FIG. 1 illustrates a cross-sectional view of a single surface mounted type LED, which is one example of the optical semiconductor device of the present invention. In the LED illustrated in FIG. 1, an optical semiconductor element 1 is die-bonded to a lead frame 2, and the semiconductor element 1 and a lead frame 3 are wire-bonded by a bonding wire 4. In addition, a frame material 5 may be affixed about the periphery of the optical semiconductor element 1. The optical semiconductor element 1 on the inside of the frame material 5 is sealed by cured product 6 of the curable silicone composition pursuant to the present invention. Furthermore, the surface of the cured product 6 may be covered with a cured product of another curable silicone composition. Examples of materials for the frame material include aromatic polyamide resin, aliphatic cyclic polyamide resin, aliphatic polyamide resin, liquid crystal polymer, silicone resin, modified silicone resin, epoxy resin, and modified epoxy resin.

A method of producing a surface mounted LED as shown in FIG. 1 would be to die-bond an optical semiconductor element 1 to a lead frame 2. This optical semiconductor element 1 and a lead frame 3 would be wire bonded to a gold bonding wire 4. Then, the curable silicone composition pursuant to the present invention would be packed on the inside of the frame material 5 that is installed about the periphery of the optical semiconductor element 1. Finally, this would be cured by heating to a temperature of 50 to 200° C.

EXAMPLES

The curable silicone composition, the cured product thereof, and the optical semiconductor device of the present invention will be described in detail hereinafter using Examples. In the Examples, the viscosity refers to the viscosity at 25° C., and Me, Vi, and Ph represent methyl groups, vinyl groups and phenyl groups, respectively. The characteristics of the cured product of the curable silicone composition were measured as follows.

Refractive Index of the Cured Product

A cured product is produced by heating the curable silicone composition at 150° C. for 2 hours in a circulating hot air oven. The refractive index of this cured product at 25° C., 633 nm wavelength was measured using a refractometer.

Oxygen Permeability of Cured Product

The curable silicone composition was cured for two hours at 150° C. using a press to complete production of a film cured product 1 mm thick. The oxygen permeability of this film cured product was measured at 23° C. using an oxygen permeability measurement apparatus from Systech Illinois (model 8001).

Initial Optical Output Efficiency of Cured Product

The optical semiconductor device shown in FIG. 1 was produced using a curable silicone composition that contains a fluorescent substance. The curable silicone composition was cured by heating for 2 hours at 150° C. The radiant flux of the resulting optical semiconductor device was measured by a total radiant flux measurement apparatus using integrating spheres.

Rate of Change in Storage Elastic Modulus of Cured Product

Cured product was produced by heating a curable silicone composition for two hours at 150° C. The storage elastic modulus of this cured product at 25° C. was measured via a dynamic analyzer. Then, the cured product was stored for 100 hours in an oven at 170° C., after which the storage elastic modulus was measured in the same manner as before. The rate of change relative to the initial hardness was found.

Reference Example 1

A total of 336.2 g of cyclic diphenylsiloxane, 502.6 g of cyclic dimethylsiloxane, 10.5 g of 1,3-divinyl-1,1,3,3-tetramethyldisiloxane and 0.25 g of potassium hydroxide were cast into a reaction vessel that was then heated to 150° C. The contents were reacted for 7 hours after the temperature of 150° C. was reached. Then, a predetermined amount of vinyldimethylchlorosilane was added to neutralize the contents, followed by removal of the low boiling fraction under vacuum. The product was colorless and clear, with a refractive index of 1.48 and viscosity of 4.5 Pa·s. It was a copolymer of dimethylsiloxane and diphenylsiloxane represented by the formula:

$ViMe_2SiO(Me_2SiO)_{120}(Ph_2SiO)_{30}SiMe_2Vi$

Reference Example 2

A total of 244.3 g of cyclic diphenylpolysiloxane, 593.6 g of cyclic dimethylpolysiloxane, 11.5 g of 1,3-divinyl-1,1,3,3-tetramethyldisiloxane and 0.25 g of potassium hydroxide were cast into a reaction vessel that was then heated to 150° C. The contents were reacted for 7 hours after the temperature of 150° C. was reached. Then, a predetermined amount of vinyldimethylchlorosilane was added to neutralize the contents, followed by removal of the low boiling fraction under vacuum. The product was colorless and clear, with a refractive index of 1.46 and viscosity of 2.4 Pa·s. It was a copolymer of dimethylsiloxane and diphenylsiloxane represented by the formula:

$ViMe_2SiO(Me_2SiO)_{130}(Ph_2SiO)_{20}SiMe_2Vi$

Reference Example 3

A total of 338.6 g of cyclic diphenylpolysiloxane, 506.2 g of cyclic dimethylpolysiloxane, 5.3 g of 1,3-divinyl-1,1,3,3-dimethyldisiloxane and 0.26 g of potassium hydroxide were cast into a reaction vessel that was then heated to 150° C. The contents were reacted for 7 hours after the temperature of 150° C. was reached. Then, a predetermined amount of vinyldimethylchlorosilane was added to neutralize the contents, followed by removal of the low boiling fraction under vacuum. The product was colorless and clear, with a refractive index of 1.48 and viscosity of 10.4 Pa·s. It was a copolymer of dimethylsiloxane and diphenylsiloxane represented by the formula:

$ViMe_2SiO(Me_2SiO)_{240}(Ph_2SiO)_{60}SiMe_2Vi$

Reference Example 4

A total of 246.3 g of cyclic diphenylpolysiloxane, 598.4 g of cyclic dimethylpolysiloxane, 5.78 g of 1,3-divinyl-1,1,3,3-dimethyldisiloxane and 0.26 g of potassium hydroxide were cast into a reaction vessel that was then heated to 150° C. The contents were reacted for 7 hours after the temperature of 150° C. was reached. Then, a predetermined amount of vinyldimethylchlorosilane was added to neutralize the contents, followed by removal of the low boiling fraction under vacuum. The product was colorless and clear, with a refractive index of 1.46 and viscosity of 5.8 Pa·s. It was a copolymer of dimethylsiloxane and diphenylsiloxane represented by the formula:

$ViMe_2SiO(Me_2SiO)_{260}(Ph_2SiO)_{40}SiMe_2Vi$

Practical Examples 1 to 7 and Comparative Examples 1 to 3

Curable silicone compositions were prepared using the following components in the composition shown in Table 1 (mass parts). The content of component (D) in Table 1 is shown via the content (ppm) of platinum metal in mass units relative to the curable silicone composition. Similarly, the content of component (E) in Table 1 is shown via the content (ppm) of cerium atoms in mass units relative to the curable silicone composition. H/Vi in Table 1 represents the molar number of silicon-bonded hydrogen atoms in component (C) relative to a total of one mol of vinyl groups in component (A) and in component (B).

The following components were used as component (A). Component (A-1): copolymer of dimethylsiloxane and diphenylsiloxane prepared in Reference Example 1 and represented by the formula:

$ViMe_2SiO(Me_2SiO)_{120}(Ph_2SiO)_{30}SiMe_2Vi$

Component (A-2): copolymer of dimethylsiloxane and diphenylsiloxane prepared in Reference Example 2 and represented by the formula:

$ViMe_2SiO(Me_2SiO)_{130}(Ph_2SiO)_{20}SiMe_2Vi$

Component (A-3): copolymer of dimethylsiloxane and diphenylsiloxane prepared in Reference Example 3 and represented by the formula:

$ViMe_2SiO(Me_2SiO)_{240}(Ph_2SiO)_{60}SiMe_2Vi$

Component (A-4): copolymer of dimethylsiloxane and diphenylsiloxane prepared in Reference Example 4 and represented by the formula:

$ViMe_2SiO(Me_2SiO)_{260}(Ph_2SiO)_{40}SiMe_2Vi$

Component (A-5): dimethylpolysiloxane with viscosity of 2,000 mPa·s represented by the formula:

$ViMe_2SiO(Me_2SiO)_{300}SiMe_2Vi$

Component (A-6): dimethylpolysiloxane with viscosity of 380 mPa·s represented by the formula:

$ViMe_2SiO(Me_2SiO)_{150}SiMe_2Vi$

The following components were used as component (B).
Component (B-1): organopolysiloxane resin with the average unit formula:

$(Me_2ViSiO_{1/2})_{0.15}(Me_3SiO_{1/2})_{0.4}(SiO_{4/2})_{0.5}$ with a mass average molecular weight of 3,000 based on standard polystyrene conversion gel permeation chromatography.

Component (B-2): organopolysiloxane resin with the average unit formula:

$(Me_2ViSiO_{1/2})_{0.15}(Me_3SiO_{1/2})_{0.45}(SiO_{4/2})_{0.4}$ with a mass average molecular weight of 1,500 based on standard polystyrene conversion gel permeation chromatography.

The following components were used as component (C).
Component (C-1): organopolysiloxane with the average unit formula:

$(SiO_{4/2})_{0.60}[(CH_3)_2HSiO_{1/2}]_{0.40}$ with viscosity of 20 mPa·s.
Component (C-2): organopolysiloxane with the average unit formula:

$(Me_2HSiO_{1/2})_{0.6}(PhSiO_{3/2})_{0.4}$ with viscosity of 30 mPa·s.

The following component was used as component (D).
Component (D-1): solution of a platinum-1,3-divinyl-1,1,3,3-tetramethyldisiloxane complex in 1,3,5,7-tetramethyl-1,3,5,7-tetravinylcyclotetrasiloxane (the solution contains 0.1 mass % of platinum)

The following component was used as component (E).
Component (E-1): cerium-containing dimethylpolysiloxane with a cerium content of 1.4% by mass.

The following component was used as component (F).
Component (F-1): 1-ethynylcyclohexanol The following component was used as component (G).
Component (G-1): adhesion promoter comprising the condensation reaction product of methylvinylsiloxane oligomer capped at both molecular terminals with silanol groups and having a viscosity of 30 mPa·s, and 3-glycidoxypropyl trimethoxysilane.

The following components were used as component (H).
Component (H-1): green aluminate fluorescent substance with mean particle diameter of 13 μm.
Component (H-2): red nitride fluorescent substance with mean particle diameter of 15 μm.

TABLE 1

|  |  | Practical Examples | | | | | |
| --- | --- | --- | --- | --- | --- | --- | --- |
|  |  | 1 | 2 | 3 | 4 | 5 | 6 |
| Curable silicone composition (parts by mass) | Component (A-1) | 62.2 | 62.2 | 60.5 | 50.1 | — | — |
| | Component (A-2) | 12.4 | 12.4 | 12.1 | 5.0 | — | — |
| | Component (A-3) | — | — | — | — | 62.6 | 62.6 |
| | Component (A-4) | — | — | — | — | 12.5 | 12.5 |
| | Component (A-5) | — | — | — | — | — | — |
| | Component (A-6) | — | — | — | — | — | — |
| | Component (B-1) | 3.1 | 3.1 | 3.0 | 6.3 | 3.1 | 3.1 |
| | Component (B-2) | 15.6 | 15.6 | 15.1 | 12.5 | 15.6 | 15.6 |
| | Component (C-1) | 5.7 | 5.7 | — | 5.0 | 5.1 | 5.1 |
| | Component (C-2) | — | — | 8.3 | — | — | — |
| | Component (D-1) | 5 ppm | 5 ppm | 5 ppm | 5 ppm | 5 ppm | 5 ppm |
| | Component (E-1) | — | 100 ppm | — | — | — | 100 ppm |
| | Component (F-1) | 0.03 | 0.03 | 0.03 | 0.03 | 0.03 | 0.03 |
| | Component (G-1) | 0.5 | 0.5 | 0.5 | 0.5 | 0.5 | 0.5 |
| H/Vi |  | 1.2 | 1.2 | 1.2 | 1.2 | 1.2 | 1.2 |
| Refractive index |  | 1.46 | 1.46 | 1.46 | 1.46 | 1.46 | 1.46 |
| Oxygen permeability (cc/m² · 24 hr) |  | 15500 | 15500 | 15500 | 14600 | 14600 | 14600 |
| Rate of change in storage elastic modulus (%) |  | — | 102 | — | — | — | 102 |

|  |  | Practical Examples | | | Comparative Examples | | |
| --- | --- | --- | --- | --- | --- | --- | --- |
|  |  | 7 | 8 | 9 | 1 | 2 | 3 |
| Curable silicone composition (parts by mass) | Component (A-1) | — | — | — | — | — | — |
| | Component (A-2) | — | — | — | — | — | — |
| | Component (A-3) | 62.2 | 74.4 | — | — | — | — |
| | Component (A-4) | 12.4 | — | 74.2 | — | — | — |
| | Component (A-5) | — | — | — | 74.5 | 72.3 | — |
| | Component (A-6) | — | — | — | — | — | 75.0 |
| | Component (B-1) | 3.1 | 3.7 | 3.7 | 3.1 | 3.0 | 3.1 |

TABLE 1-continued

|  | | | | | | |
|---|---|---|---|---|---|---|
| Component (B-2) | 15.6 | 14.9 | 14.8 | 15.5 | 15.1 | 15.6 |
| Component (C-1) | — | 6.1 | 6.3 | 5.9 | — | 5.3 |
| Component (C-2) | 5.7 | — | — | — | 8.6 | — |
| Component (D-1) | 5 ppm | 5 ppm | 5 ppm | 5 ppm | 5 ppm | 5 ppm |
| Component (E-1) | — | — | — | — | — | — |
| Component (F-1) | 0.03 | 0.03 | 0.03 | 0.03 | 0.03 | 0.03 |
| Component (G-1) | 0.5 | 0.5 | 0.5 | 0.5 | 0.5 | 0.5 |
| H/Vi | 1.2 | 1.2 | 1.2 | 1.2 | 1.2 | 1.2 |
| Refractive index | 1.46 | 1.47 | 1.43 | 1.41 | 1.41 | 1.41 |
| Oxygen permeability (cc/m$^2$ · 24 hr) | 14700 | 13750 | 27800 | 48000 | 42000 | 44000 |
| Rate of change in storage elastic modulus (%) | — | — | — | 121 | — | — |

Practical Examples 10 to 12 and Comparative Example 4

Curable silicone compositions were prepared by combining the aforementioned components in the compositions (mass parts) shown in Table 2. The optical semiconductor device shown in FIG. 1 was produced using these curable silicone compositions. The curable silicone composition was cured by heating for 2 hours in an oven at 150° C. Thereafter, the initial luminous flux was measured by a total radiant flux measurement apparatus using integrating spheres. The initial rate of change in the luminous flux was calculated taking the initial luminous flux of Comparative Example 4 as 100%.

TABLE 2

|  |  | Practical Example 10 | Practical Example 11 | Practical Example 12 | Comparative Example 4 |
|---|---|---|---|---|---|
| Curable silicone composition (mass parts) | Component (A-1) | 62.2 | 60.5 | — | — |
|  | Component (A-2) | 12.4 | 12.1 | — | — |
|  | Component (A-3) | — | — | 62.6 | — |
|  | Component (A-4) | — | — | 12.5 | — |
|  | Component (A-5) | — | — | — | 74.5 |
|  | Component (B-1) | 3.1 | 3.0 | 3.1 | 3.1 |
|  | Component (B-2) | 15.6 | 15.1 | 15.6 | 15.5 |
|  | Component (C-1) | 5.7 | — | 5.1 | 5.9 |
|  | Component (C-2) | — | 8.3 | — | — |
|  | Component (D-1) | 5 ppm | 5 ppm | 5 ppm | 5 ppm |
|  | Component (F-1) | 0.03 | 0.03 | 0.03 | 0.03 |
|  | Component (G-1) | 0.5 | 0.5 | 0.5 | 0.5 |
|  | Component (H-1) | 30.9 | 30.9 | 30.8 | 30.9 |
|  | Component (H-2) | 7.5 | 7.5 | 7.5 | 7.5 |
| H/Vi |  | 1.2 | 1.2 | 1.2 | 1.2 |
| Initial rate of change in luminous flux (%) |  | 106 | 105 | 107 | 100 |

INDUSTRIAL APPLICABILITY

Even when organopolysiloxane resin is incorporated in the curable silicone composition of the present invention in order to form a silicone cured product with moderate hardness and strength, the marked viscosity elevation of the resulting composition can be inhibited. Furthermore, the fluidity and packing properties are outstanding, and when used as a LED sealant, it has outstanding gas barrier properties. The initial optical output efficiency of an optical semiconductor device can be enhanced. Consequently, the curable silicone composition of the present invention is useful as a sealant-filler in various types of electrical/electronic components. In particular, when the cured product of the present invention is transparent, it is useful as an optical unit through which light permeates, such as visible light, infrared light, ultraviolet light, far ultraviolet rays, X-rays and lasers.

DESCRIPTION OF SYMBOLS

1 Optical semiconductor element
2 Lead frame
3 Lead frame
4 Bonding wire
5 Frame material
6 Cured product of the curable silicone composition

The invention claimed is:
1. A curable silicone composition comprising:
(A) a diorganopolysiloxane having at least two alkenyl groups in a molecule and containing siloxane units represented by the formula: $R^1{}_2SiO_{2/2}$ wherein each $R^1$ independently represents an aryl group;
(B) at least two types of resinous organopolysiloxanes having different mass average molecular weights based on standard polystyrene conversion gel permeation chromatography, and each comprising siloxane units represented by the formula: $SiO_{4/2}$, siloxane units represented by the formula: $R^2{}_2R^3SiO_{1/2}$ wherein each $R^2$ independently represents a monovalent hydrocarbon group lacking aliphatic unsaturated bonds and each $R^3$ independently represents an alkenyl group, and siloxane units represented by the formula: $R^2{}_3SiO_{1/2}$ wherein $R^2$ is as defined above, in an amount of 10 to 100 parts by mass per 100 parts by mass of component (A);
(C) an organopolysiloxane having at least two silicon-bonded hydrogen atoms in a molecule, in an amount so that the amount of silicon-bonded hydrogen atoms in component (C) is from 0.1 to 10 mol per 1 mol of total alkenyl groups in components (A) and (B); and

(D) a catalytic amount of hydrosilylation reaction catalyst.

2. The curable silicone composition of claim 1, wherein component (A) is an organopolysiloxane represented by the general formula:

[Formula 1]

wherein each $R^1$ independently represents aryl groups, each $R^3$ independently represents alkenyl groups, each $R^4$ independently represents monovalent hydrocarbon groups, each $R^5$ independently represents monovalent hydrocarbon groups lacking aryl groups, and m represents an integer of 1 to 800, n represents an integer of 1 to 400, m≥n, and 5≤m+n≤1,000.

3. The curable silicone composition of claim 2, wherein component (B) constitutes at least two types of resinous organopolysiloxanes in which the difference in their mass average molecular weights is at least 1,000.

4. The curable silicone composition of claim 1, wherein component (B) constitutes at least two types of resinous organopolysiloxanes in which the difference in their mass average molecular weights is at least 1,000.

5. The curable silicone composition of claim 1, further comprising (E) a cerium-containing organopolysiloxane, in an amount that cerium atoms in component (E) is 10 to 2,000 ppm in mass units relative to the curable silicone composition.

6. The curable silicone composition of claim 1, further comprising (F) a hydrosilylation reaction inhibitor, in an amount of 0.01 to 3 parts by mass per a total 100 parts by mass of components (A) to (C).

7. The curable silicone composition of claim 1, further comprising (G) an adhesion promoter, in an amount of 0.01 to 10 parts by mass per a total 100 parts by mass of components (A) to (C).

8. The curable silicone composition of claim 1, further comprising (H) a fluorescent substance, in an amount of 0.1 to 70% by mass of the curable silicone composition.

9. A cured product produced by curing the curable silicone composition according to claim 1.

10. An optical semiconductor device comprising an optical semiconductor element sealed with a cured product of the curable silicone composition according to claim 1.

* * * * *